US012733426B2

(12) United States Patent
Thottappayil et al.

(10) Patent No.: US 12,733,426 B2
(45) Date of Patent: Sep. 8, 2026

(54) REACTION CHAMBER FOR PROCESSING SEMICONDUCTOR SUBSTRATES WITH GAS FLOW CONTROL CAPABILITY

(71) Applicant: ASM IP Holding B.V., Almere (NL)

(72) Inventors: Arun Thottappayil, Hwaseong (KR); DongRak Jung, Hwaseong (KR)

(73) Assignee: ASM IP Holding B.V., Almere (NL)

( * ) Notice: Subject to any disclaimer, the term of this patent is extended or adjusted under 35 U.S.C. 154(b) by 495 days.

(21) Appl. No.: 18/210,739

(22) Filed: Jun. 16, 2023

(65) Prior Publication Data

US 2023/0411176 A1 Dec. 21, 2023

Related U.S. Application Data

(60) Provisional application No. 63/354,084, filed on Jun. 21, 2022.

(51) Int. Cl.
*H10P 72/00* (2026.01)

(52) U.S. Cl.
CPC ................................ *H10P 72/0402* (2026.01)

(58) Field of Classification Search
CPC ............. H10P 72/0402; H10P 72/0462; C23C 16/4412; C23C 16/45559; C23C 16/54
See application file for complete search history.

(56) References Cited

U.S. PATENT DOCUMENTS 8,215,264 B2 7/2012 Hong
9,741,575 B2 * 8/2017 Lin .................. C23C 16/45565
10,781,516 B2 * 9/2020 Chandrasekharan ........................ C23C 16/4409
11,251,068 B2 2/2022 Roh
2014/0076234 A1 * 3/2014 Kao ...................... C23C 14/022 118/719
2014/0326185 A1 * 11/2014 Lau .................. C23C 16/45563 118/728
2017/0369994 A1 12/2017 Lee
2021/0130953 A1 * 5/2021 Mustafa .............. C23C 16/4585
2022/0259731 A1 * 8/2022 Tsuji ................. C23C 16/45536

FOREIGN PATENT DOCUMENTS

CN 112951697 A * 6/2021 ........ H01J 37/32449
JP 6796380 B2 * 12/2020 ........... C23C 16/303
KR 20100047573 A * 5/2010 ......... C23C 16/4412
KR 20140115795 A * 10/2014 ........ H01J 37/32477
KR 2021065872 A * 6/2021 ........ H01J 37/32477
TW 201437427 A * 10/2014 .......... H10P 72/0436

* cited by examiner

*Primary Examiner* — Mohammed Shamsuzzaman
(74) *Attorney, Agent, or Firm* — Snell & Wilmer L.L.P.

(57) ABSTRACT

Apparatus, particularly reaction chamber for processing semiconductor substrate is presented. A reaction chamber with gas exit flow control capability comprises an upper body, a substrate supporting part, a shower head for letting in gas which is used for processing the substrate, a lower body comprising duct, wherein the duct has a multiple of duct holes and a flow control liner configured to surround the duct and the flow control liner has a multiple of flow holes, wherein the duct holes and flow holes are used to control the exit flow of the gas used for substrate processing, and the flow control liner may rotate around so that the duct holes and the flow holes can be overlapped. The duct can have scribe mark for various hole sizes and shapes.

11 Claims, 8 Drawing Sheets

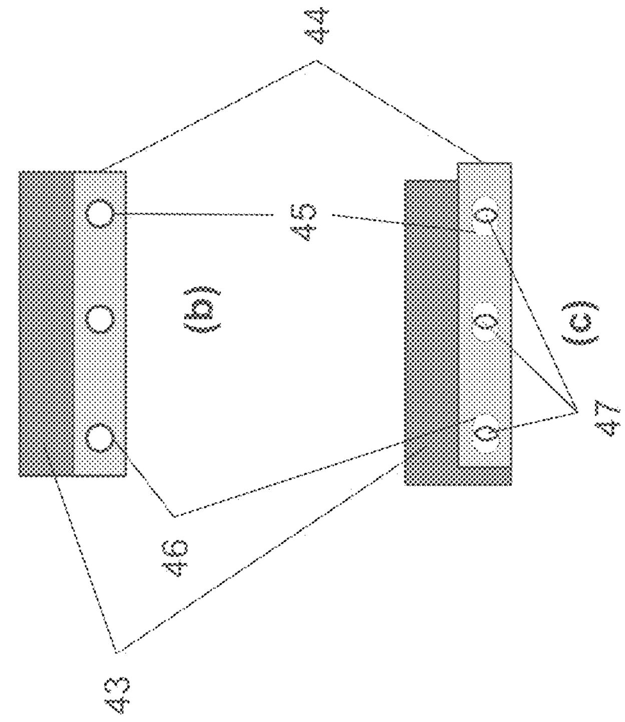
Fig 4
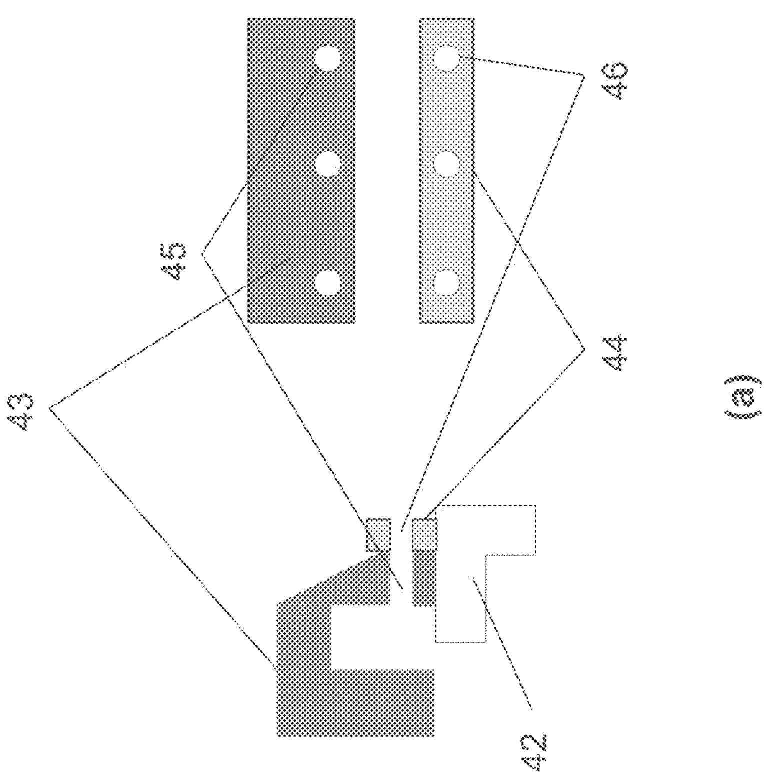

72
J
74
73

(b)
A'
76
71
75
73-1
(a)
7
A

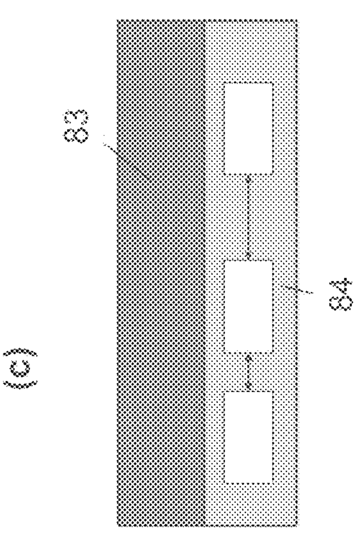
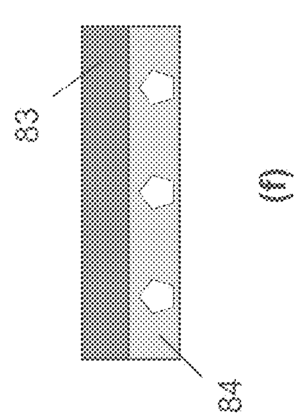
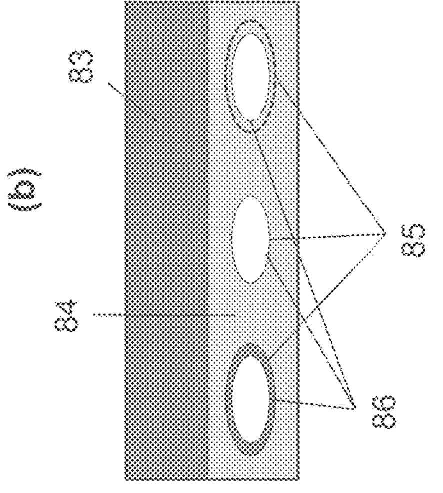
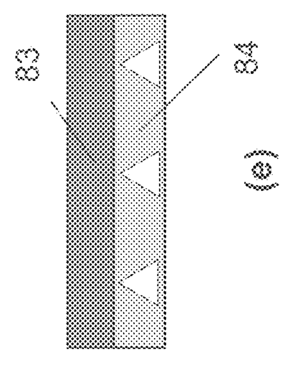
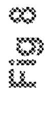
Fig 8
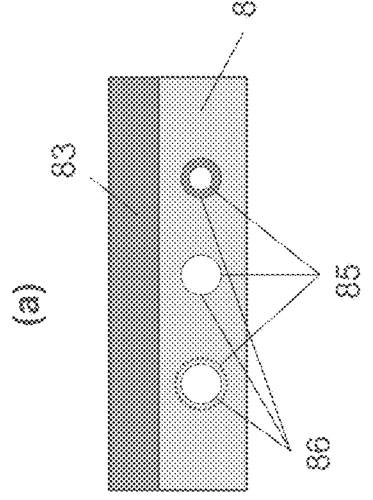
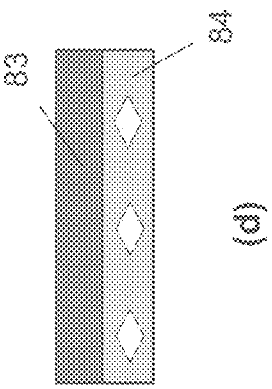

REACTION CHAMBER FOR PROCESSING SEMICONDUCTOR SUBSTRATES WITH GAS FLOW CONTROL CAPABILITY

CROSS-REFERENCE TO RELATED APPLICATIONS

This application claims priority to U.S. Provisional Patent Application Ser. No. 63/354,084, filed Jun. 21, 2022, and titled REACTION CHAMBER FOR PROCESSING SEMICONDUCTOR SUBSTRATES WITH GAS FLOW CONTROL CAPABILITY, the disclosure of which is hereby incorporated by reference in its entirety.

BACKGROUND

Technical Field

The present disclosures relate to a semiconductor processing apparatus and more particularly to a reaction chamber for processing semiconductor substrates with a gas flow control capability which can improve thin film uniformity.

Description of the Related Arts

As shown in FIG. 1, the reaction chambers (RC1-RC4) are placed in a substrate processing apparatus 1. Precursor and other gases can be used for processing the substrates in the reaction chamber 1 and the gases (precursor) should exit the chambers when the reactions are done. The arrows A show the gas exit directions for each of the chambers. The reactions in the chambers are decided with many criteria but the contact time between the substrate and the gas is a big factor.

If the gases are exiting the chambers just like the arrows A, then the contact time of a substrate in a chamber different in different area of the substrate. This can be shown in FIG. 3 (*a*). RC3 (reaction chamber 3)'s area A has a relatively longer contact time while area B has a relatively shorter contact time. This is because the gas exhaust hole 11, 31 is in North-East direction in relation to the RC3.

More importantly, FIG. 2 shows the conventional structure of the reaction chamber 2 for exiting the precursor (and gas) after reaction. Shower head 21 lets in the gas into the chamber and substrate is located on the substrate supporting part 29. The gas is exiting the chamber through the gap (in this embodiment the width of the gap is 1 mm) shown in FIG. 2 (*b*). The chamber has its lower part which comprises duct 23 and this duct 23 and flow control ring 22 is placed 1 mm apart from each other. As shown in FIG. 1, there is just one exhaust hole for each chamber. So even though pumped out quickly, there is a high possibility of wafer thickness shift (non-uniform thickness of wafer) happening radially.

For this reaction chamber structure, it would always be possible that non-uniform film thickness happens to wafers.

SUMMARY

In accordance with one embodiment of the present disclosure, a reaction chamber for processing substrates comprising an upper body, a substrate supporting part, a shower head for letting in gas which is used for processing the substrate, a lower body comprising duct, wherein the duct has a multiple of duct holes and a flow control liner configured to surround the duct and the flow control liner has a multiple of flow holes, wherein the duct holes and flow holes are used to control the exit flow of the gas used for substrate processing, and the flow control liner may rotate around so that the duct holes and the flow holes can be overlapped.

According to another embodiment of the present disclosure, a reaction chamber for processing substrates comprising an upper body, a substrate supporting part, a shower head for letting in gas which is used for processing the substrate, a lower body comprising duct, wherein the duct has a multiple of duct holes, a flow control ring surrounds the lower body below the duct and a flow control liner configured to surround the duct above the flow control ring and the flow control liner has a multiple of flow holes, wherein the duct holes and flow holes are used to control the exit flow of the gas used for substrate processing, and the flow control liner may rotate around so that the duct holes and the flow holes can be overlapped.

The reaction chamber of the present disclosure can be that the flow control liner can be divided into pieces and the number of pieces can be from 1 to 8.

The reaction chamber of the present disclosure can be that the pieces are divided such that each piece can move as much as it touches its neighboring piece, and the pieces move independently of the other pieces.

And the duct holes and the flow holes have shape, and the shape includes circle, ellipse, triangle, rectangle, parallelogram, rhombus, pentagon, and polygons with more than 6 edges.

And the present disclosure's duct has scribe marks on it for easy measurement of openness rate of the shape of the holes.

According to the present disclosure, the duct holes and the flow holes may be spaced unevenly.

According to the present disclosure, the size of the duct holes can be different from each other and the size of the flow holes can be different from each other.

BRIEF DESCRIPTION OF THE DRAWINGS

FIG. 4 shows detailed view of flow control components according to an embodiment of the present disclosure.

FIG. 8 shows detailed view of the shapes and sizes of the holes according to another embodiment of the present disclosure.

DETAILED DESCRIPTION OF THE DISCLOSURE

Figure 1:
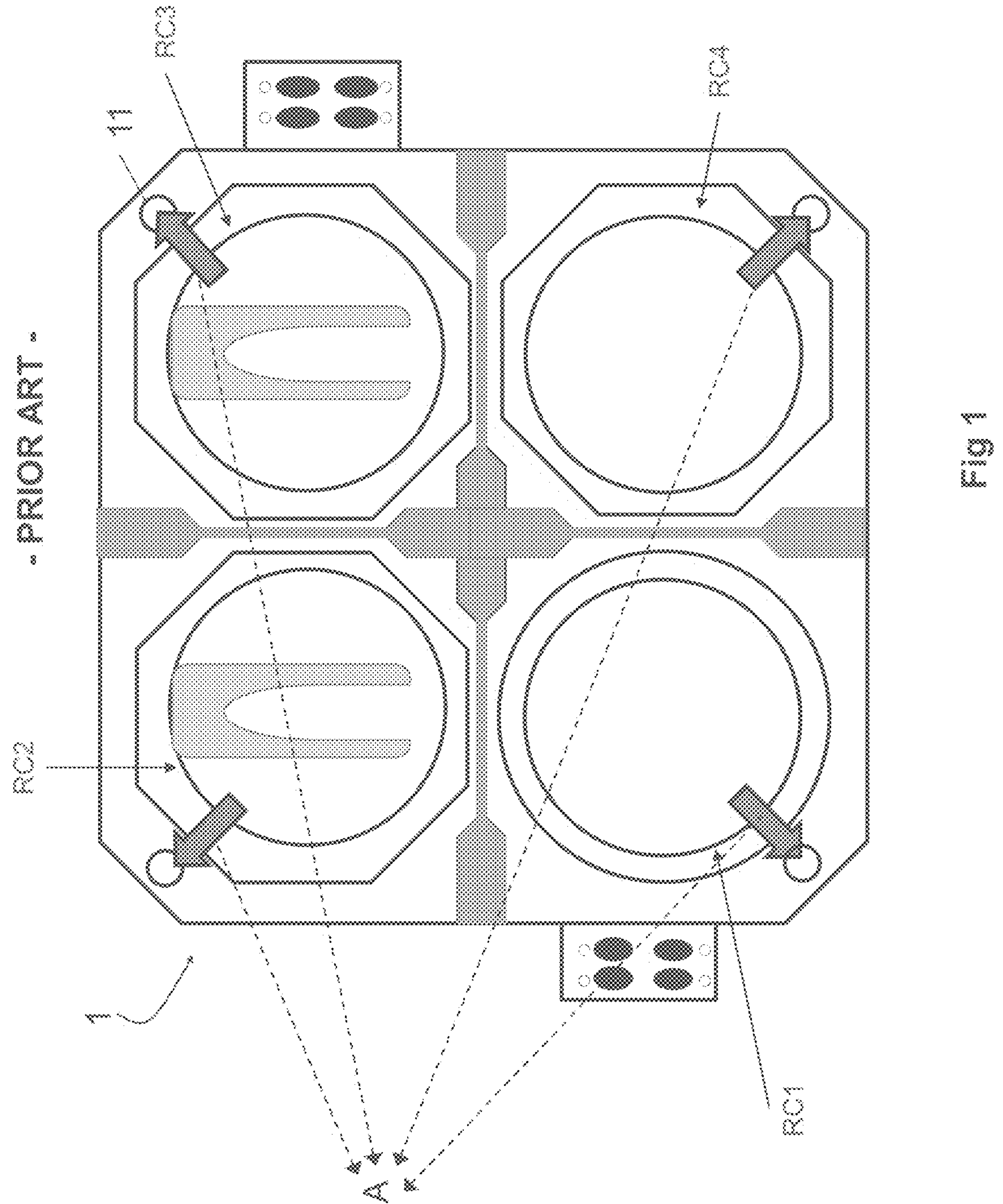
FIG. 1 shows a prior art conceptual diagram of substrate processing apparatus.
Figure 2:
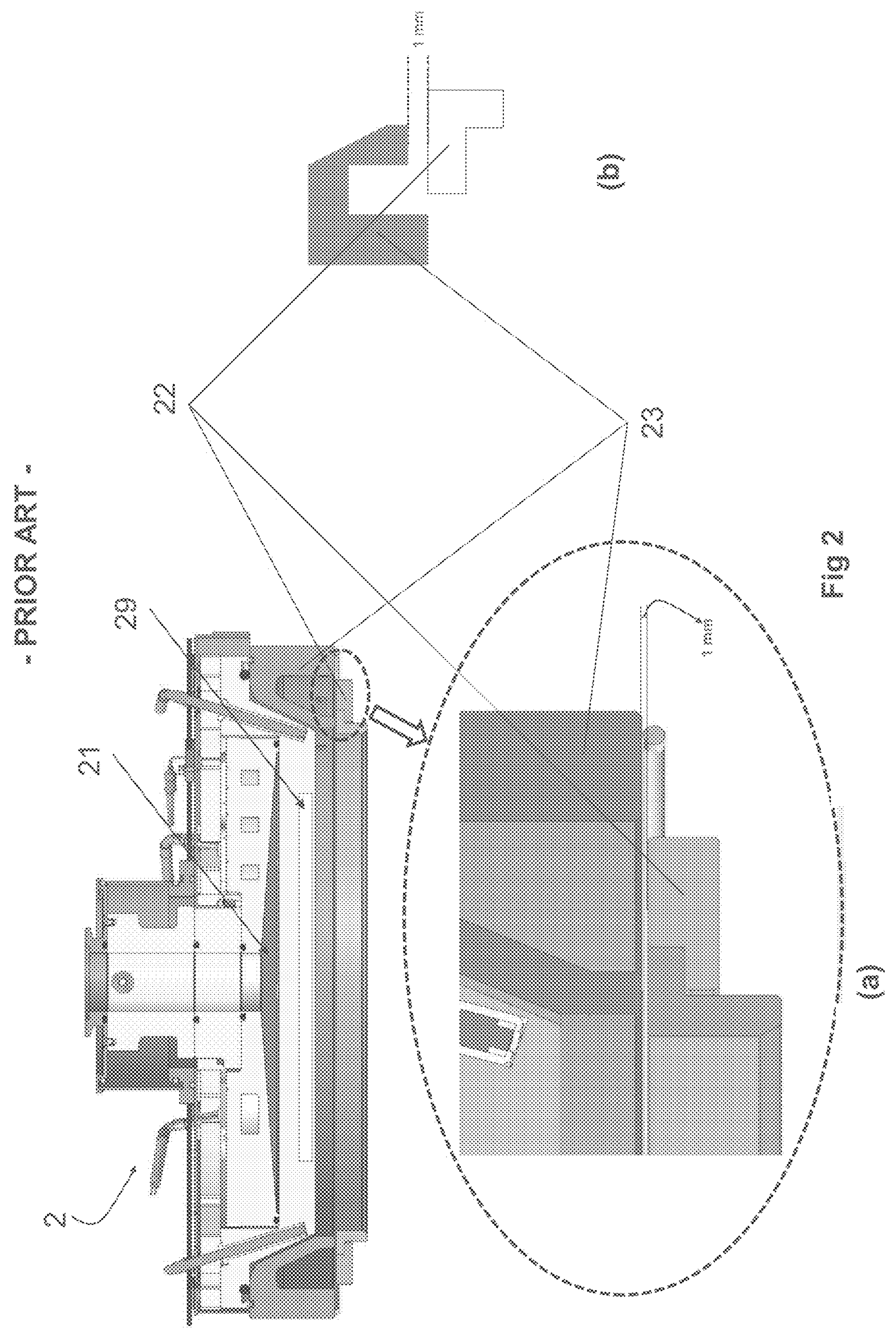
FIG. 2 shows a cross-sectional view of the gas exit gap used in the prior art.

In this disclosure, the word 'wafer' has almost identical meaning with the word 'substrate' and can be used interchangeably in this respect.

As stated earlier, the conventional reaction chamber's lower part, more specifically duct in the lower part, has no holes in it. Only the gap between the duct and the flow control ring (FCR) works as an exit for the gas.

In FIG. 4 (*a*), duct 43 and flow control liner (FCL) 44 are shown according to the present disclosure. Duct 43 has a multiple of duct hole 45 and the FCL 44 also has a multiple of flow hole 46. Flow control ring (FCR) 42 can also be placed below the FCL 44. In FIG. 4 (*b*), the duct 43 and the FCL 44 is placed in place such that the duct holes 45 and flow holes 46 can be overlapped. In FIG. 4 (*c*), the FCL 44 can be rotated radially such that the holes 45, 46 can be partially overlapped and only a fraction of the original hole is through 47. In this case the gas exit flow is not as big as it is fully open like in FIG. 4 (*b*). This means a skewed profile of its wafer.

Figure 5:
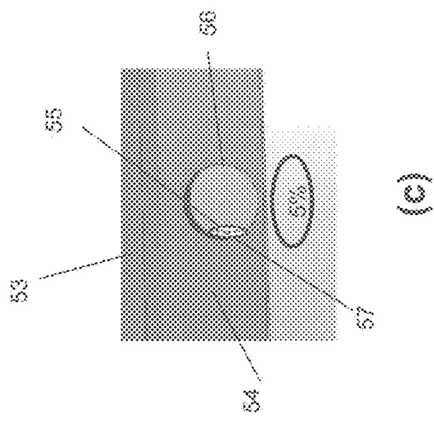
FIG. 5 shows detailed view of how the flow control is working according to an embodiment of the present disclosure.
Figure 5:
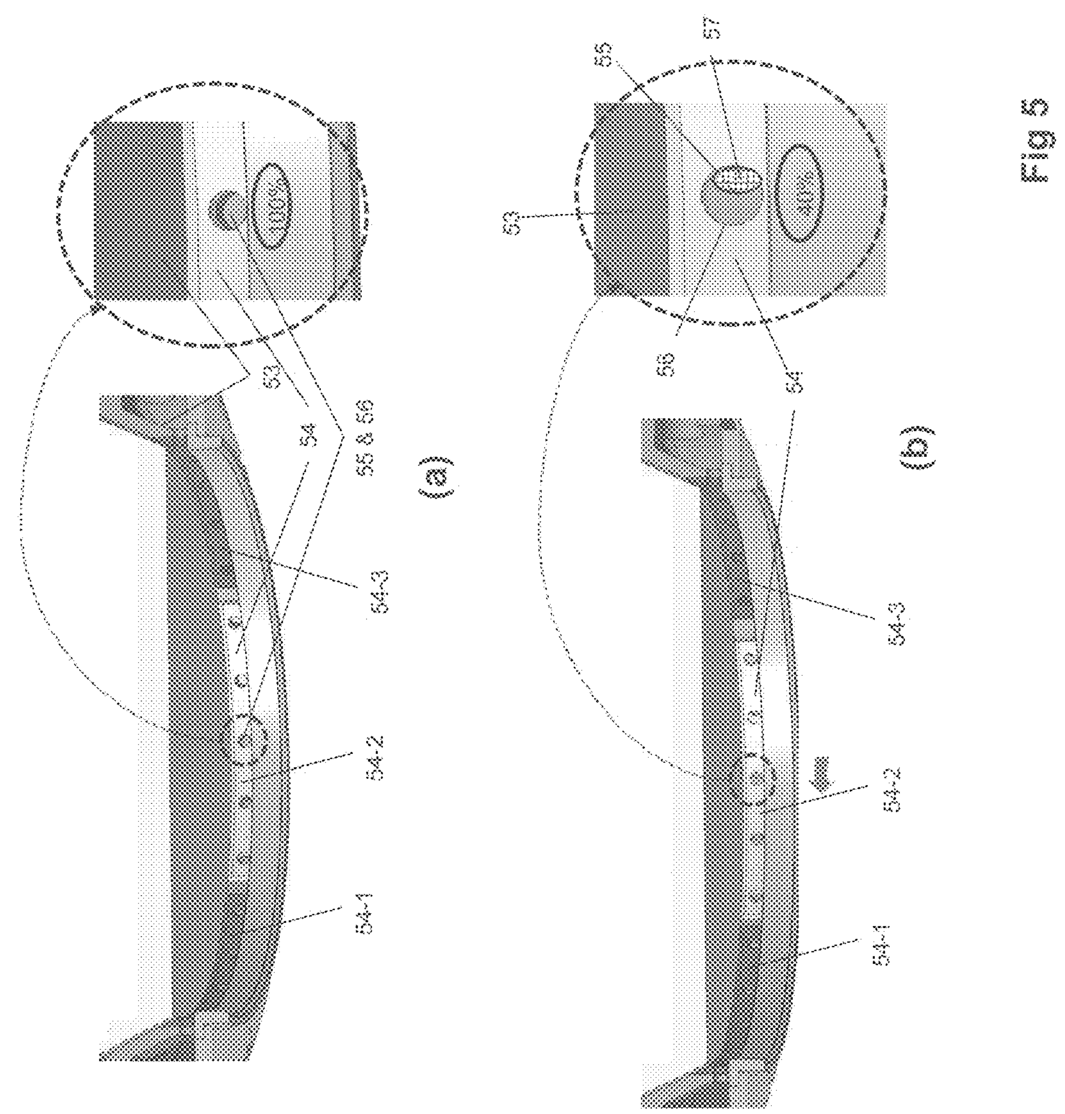

The rate of openness or openness percentage is explained in FIG. 5. In FIG. 5 (*a*), the circles (duct hole 55 and flow hole 56) intersect with each other so that there is a clear through-hole. The rate of openness is the ratio of 'Area of complete through' divided by 'Area of the smallest of the two holes (either duct hole or flow hole)'. Therefore, if the size of the duct hole and flow hole is the same just like in FIG. 5 (*b*) & (c)'s examples, the openness rate is the intersected area 57 divided by the area of the hole's circle respectively.

Figure 3:
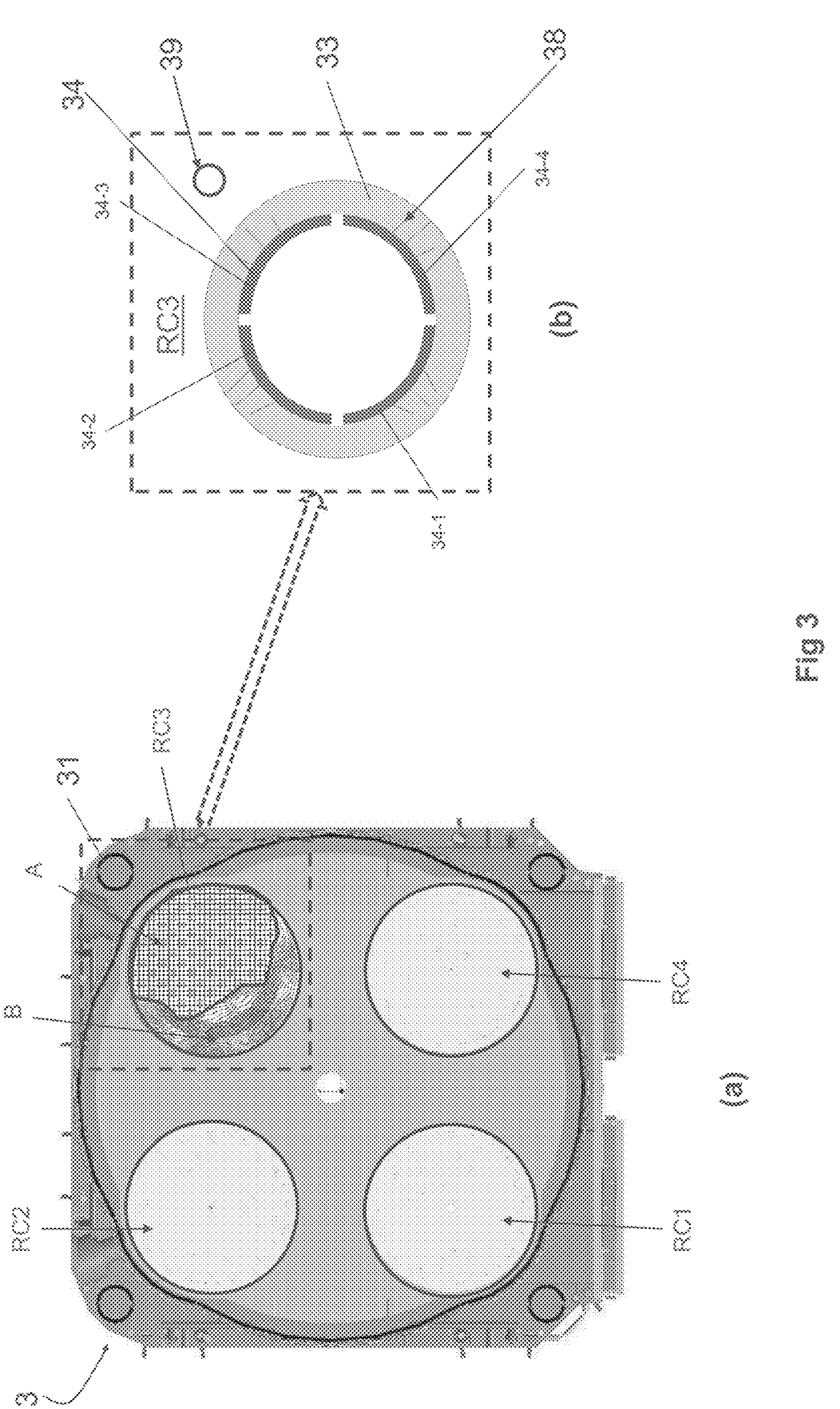
FIG. 3 shows a conceptual view of a reaction chamber according to an embodiment of the present disclosure.

In FIG. 3, in the substrate processing apparatus 3, RC3 is in right upside and the gas exhaust hole 31 is in right upside (NE) in relation to RC3. FCL 34 and duct 33 is shown in FIG. 3 (*b*).

Figure 7:
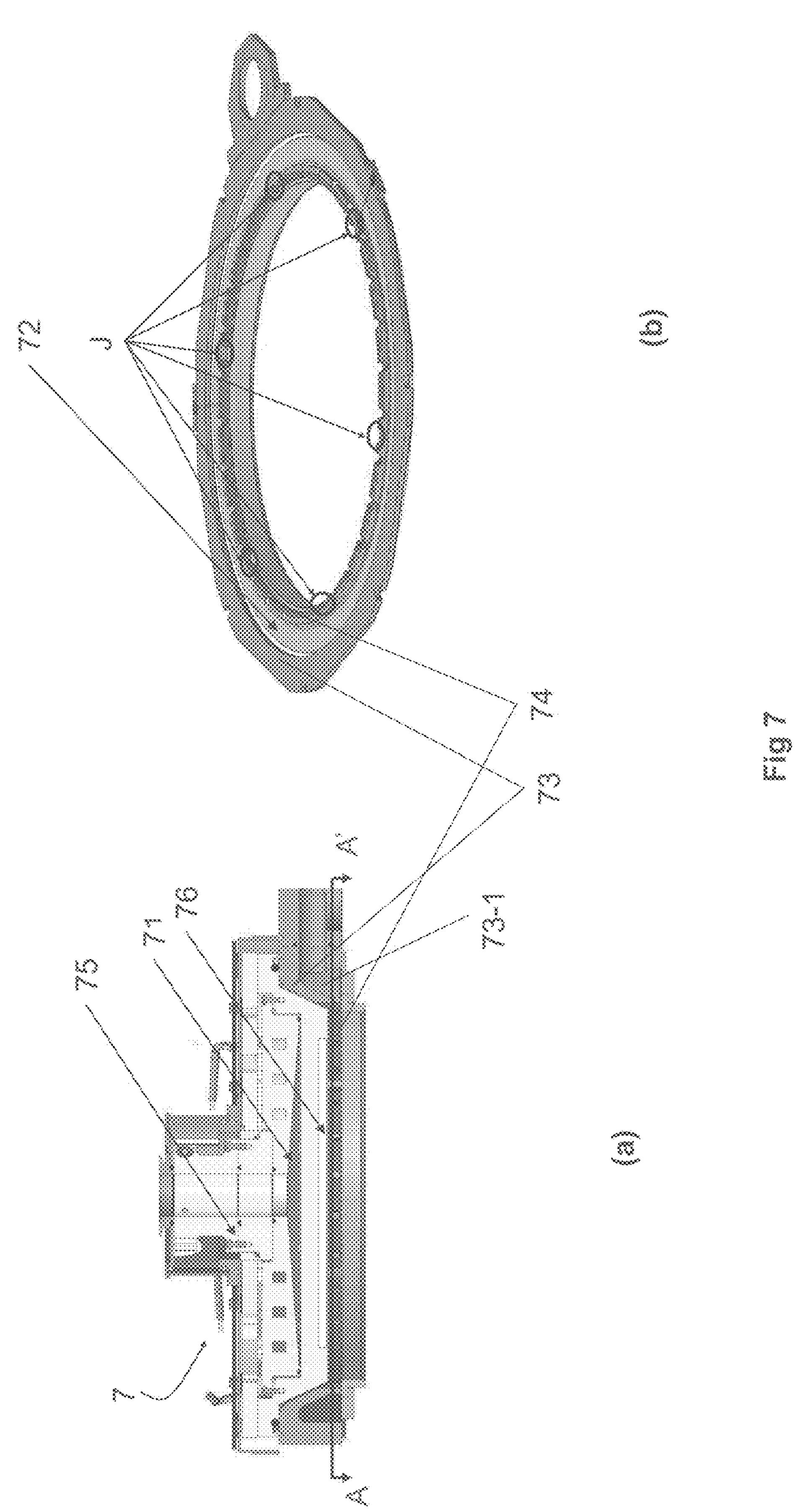
FIG. 7 shows detailed view of the reaction chamber according to an embodiment of the present disclosure.

In FIG. 7 (*a*), one aspect of the present disclosure is shown. The reaction chamber 7 comprises an upper part 75 and shower head 71 which can lead in the gas and/or precursor which would be used for processing the wafer placed on the substrate supporting part 76. The chamber 7 has a lower part 73 and the lower part 73 includes duct 73-1. FCR 72 can be placed in the duct 73. Although FCR 72 is drawn in the figures and explained in this specification, the lower part 73 of the chamber 7 can be formed so that the FCR 72 may not be needed in this disclosure.

Figure 6:
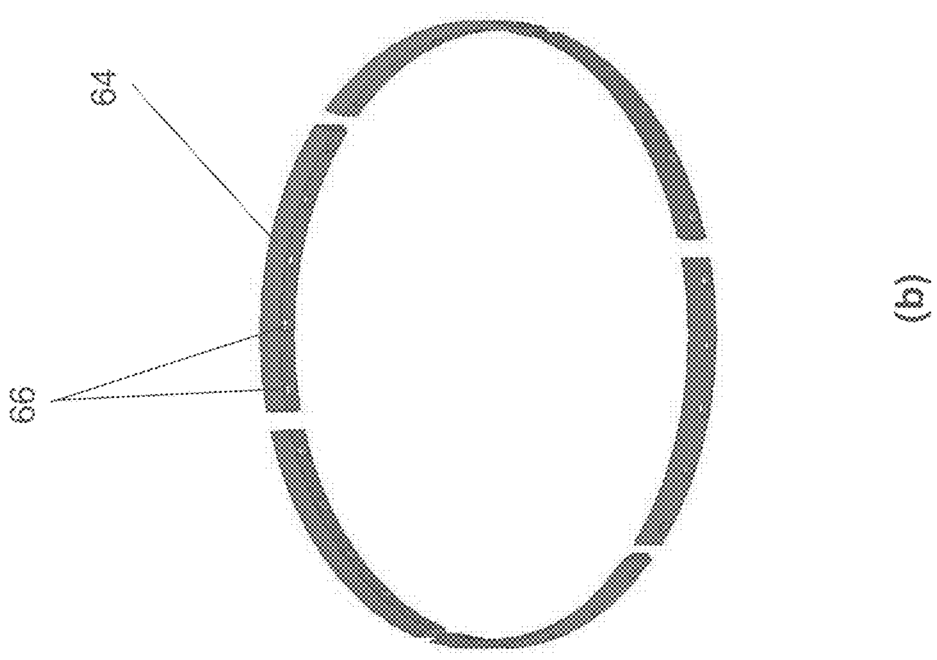
FIG. 6 shows detailed view of the reaction chamber according to another embodiment of the present disclosure.
Figure 6:
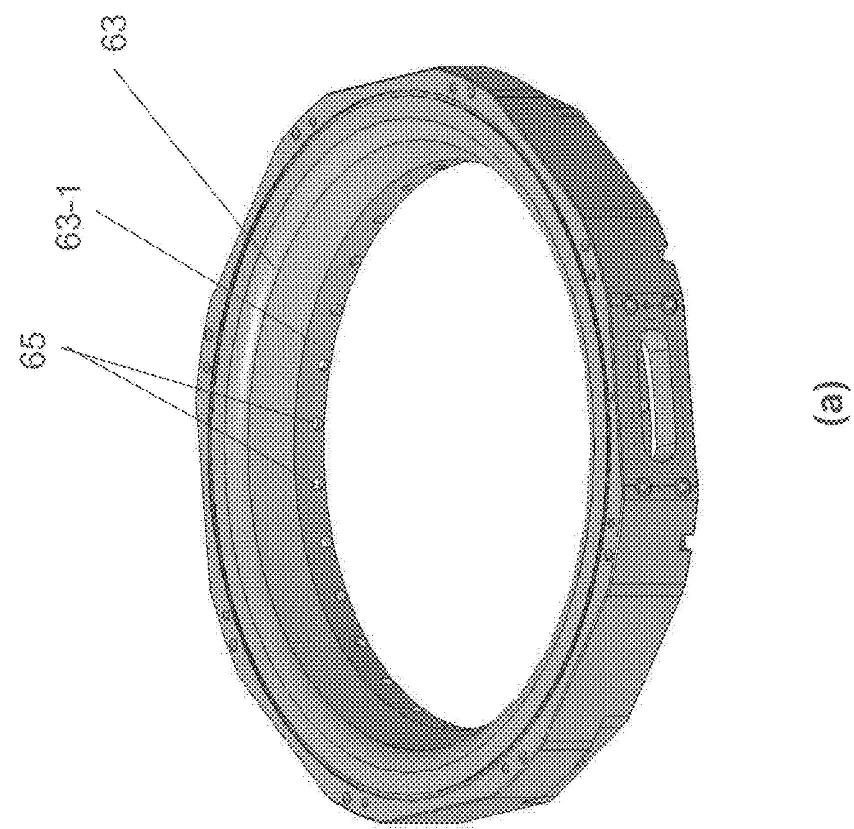

FIG. 7 (*b*) is a cross-sectional view of FIG. 7 (*a*)'s A-A' line. The six joints designated as J in (b) shows that this is a 6-piece FCL 74. FIG. 6's (a) and (b) shows a detailed structure of lower part 63 and duct 63-1 with duct holes 65 and FCL 64 with flow holes 66 respectively. FIG. 7 (*b*) shows a 6-piece FCL 64. In FIG. 3 (*b*), a 4-piece FCL 34 is also shown. The number of FCL's pieces may vary to achieve a good gas exit flow for uniformity film thickness.

It should be noted that each piece of the FCL 64 can be moved (rotated) around as much as it can move before it touches its neighboring FCL piece. In this way, this disclosure can control the gas exit flow locally. This means that if any profile of wafer after reaction comes out as skewed and not uniform, the number of pieces of FCL may be decided and the rate of openness for each piece can be fine-tuned for better uniformity.

In FIG. 5, this local control by the present disclosure is shown. In FIG. 5 (*a*), the pieces of FCL 54, i.e. 54-1, 54-2, 54-3 are placed in the right place where the duct holes 55 in the duct 53 are perfectly overlapped with the flow holes 56 of FCL 54 so the rate of openness is 100%. In FIG. 5 (*b*), the FCL 54's one piece 54-2 moved (rotated) around to the left in the drawing. The right figure of FIG. 5 (*b*) shows the left shift of the FCL 54. Therefore, the rest pieces of the FCL 54 are intact while this specific piece of FCL 54-2 moves to the left. Therefore, the holes in FCL piece 54-2 partly block the duct holes 55 and the rate of openness is 40%.

Also, FIG. 5 (*c*) shows one extreme case of openness by FCL piece's shifting. This kind of independent movement of the FCL pieces can boost up the uniformity of wafer in the chamber.

Let's suppose we have a skewed profile like in FIG. 3 (*a*). If we use a 4-piece FCL 34 like FIG. 3 (*b*) then we can shift the FCL piece 34-1 so that the rate of openness reaches 5% just like in FIG. 5 (*c*) while we keep the rate of openness of FCL pieces 34-2 & 34-4 to 50% by shifting a little. And we keep the piece 34-3 with the holes fully open (100% openness rate). The openness rate of each piece can be calibrated in more detail referring to the accumulated info. on the skewness of the profiles of the reaction chamber. By the movement of piece 34-1, the wafer's piece 34-1 corner can have longer gas contact time than usual cases. (By 5% openness) And wafer's piece 34-3 corner can have shorter gas contact time than usual cases. (By 100% openness) In this way, the skewed profile of wafer can be improved.

Scribe mark 38 on the duct 33 in FIG. 3 (*b*) may make it easier for measuring the openness percentage rate when one may try to increase or decrease the wafer's gas contact time in that corner region for film uniformity.

In FIG. 8, it is shown that there could be many variations on the hole shape, either the duct holes or the flow holes, or both the duct holes and the flow holes.

In FIG. 8 (*a*), the shape of both holes (duct & flow) are circles while the size of the duct hole circles is somewhat different from each other. In FIG. 8 (*b*) the shape of the holes are ellipses while the size of the flow hole circles is different from each other. This different size may enable user or operator of the chamber to fine-tune the percentage of openness in more subtle skewed profile situations.

In FIG. 8 (*c*), the shape is rectangle while the distance is not even. (It should be noted that the distance between the shapes of duct holes 86 or flow holes 85 are the same in FIG. 8's (a), (b), (d), (e), and (f)) This irregularity in distance between the shapes may help user or operator of the chamber to fine-tune the rate of openness in more subtle skewed profile situation just like in FIG. 8 (*a*) or FIG. 8 (*b*).

The shape in FIG. 8's (d), (e), (f) are rhombus, triangle, and pentagon respectively. This is just examples and the shape can be any polygon with the edge number equal to or more than 6, i.e., hexagon, heptagon etc. Of course, it should be noted that in each of the shape the size and distance can be different from each other just like in (a), (b) or (c).

The present disclosure proposes an apparatus to solve the wafer thickness radial shift due to the asymmetric pumping out of the gas (or precursor) from the reaction chamber. It can control the rate of gas exit flow from the chamber so that the wafer's gas contact time can be controlled locally, and the film thickness difference of the wafer could be reduced from it.

The above-described arrangements of apparatus are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed:

1. A reaction chamber for processing substrates comprising:

an upper body;

a substrate supporting part;

a showerhead for letting in gas which is used for processing the substrate;

a lower body comprising duct, wherein the duct has a multiple of duct holes; and a flow control liner configured to surround the duct and the flow control liner has a multiple of flow holes, wherein the duct holes and flow holes are used to control the exit flow of the gas used for substrate processing, and the flow control liner may rotate around so that the duct holes and the flow holes can be overlapped, wherein the duct has scribe marks on it for easy measurement of openness rate for various size and shape of the holes, and wherein the flow control liner is divided into pieces such that each piece can move as much as it touches its neighboring piece, and each piece moves independently of the other pieces.

2. The chamber according to claim 1, wherein the shape includes circle, ellipse, triangle, rectangle, parallelogram, rhombus, pentagon, and polygons with more than 6 edges.

3. The chamber according to claim 1, wherein the duct holes and the flow holes are spaced unevenly.

4. The chamber according to claim 1, wherein the size of the duct holes can be different from each other.

5. The chamber according to claim 1, wherein the size of the flow holes can be different from each other.

6. A reaction chamber for processing substrates comprising:

an upper body;

a substrate supporting part;

a shower head for letting in gas which is used for processing the substrate;

a lower body comprising duct, wherein the duct has a multiple of duct holes;

a flow control ring surrounds the lower body below the duct; and a flow control liner configured to surround the duct above the flow control ring and the flow control liner has a multiple of flow holes, wherein the duct holes and flow holes are used to control the exit flow of the gas used for substrate processing, and the flow control liner may rotate around so that the duct holes and the flow holes can be overlapped, wherein the duct has scribe marks on it for easy measurement of openness rate for various size and shape of the holes, and wherein the flow control liner is divided into pieces such that each piece can move as much as it touches its neighboring piece, and each piece moves independently of the other pieces.

7. The chamber according to claim 6, wherein a number of pieces can be from 1 to 8.

8. The chamber according to claim 6, wherein the shape includes circle, ellipse, triangle, rectangle, parallelogram, rhombus, pentagon, and polygons with more than 6 edges.

9. The chamber according to claim 6, wherein the duct holes and the flow holes are spaced unevenly.

10. The chamber according to claim 6, wherein the size of the duct holes can be different from each other.

11. The chamber according to claim 6, wherein the size of the flow holes can be different from each other.

* * * * *